(12) United States Patent
Lerman

(10) Patent No.: US 9,697,114 B2
(45) Date of Patent: Jul. 4, 2017

(54) NETMORY

(71) Applicant: Mikhael Lerman, San Jose, CA (US)

(72) Inventor: Mikhael Lerman, San Jose, CA (US)

( * ) Notice: Subject to any disclaimer, the term of this patent is extended or adjusted under 35 U.S.C. 154(b) by 0 days.

(21) Appl. No.: 14/461,424

(22) Filed: Aug. 17, 2014

(65) Prior Publication Data

US 2016/0048477 A1 Feb. 18, 2016

(51) Int. Cl.
*G06F 12/02* (2006.01)
*G06F 12/06* (2006.01)
*G06F 15/76* (2006.01)
*G11C 5/04* (2006.01)

(52) U.S. Cl.
CPC ...... *G06F 12/0238* (2013.01); *G06F 12/0623* (2013.01); *G06F 15/76* (2013.01); *G11C 5/04* (2013.01); *G06F 2212/254* (2013.01)

(58) Field of Classification Search
None
See application file for complete search history.

(56) References Cited

U.S. PATENT DOCUMENTS

| | | | | |
|---|---|---|---|---|
| 5,867,669 A * | 2/1999 | Breen | ............ | G06F 13/387 370/463 |
| 8,935,506 B1 * | 1/2015 | Gopalan | ............ | G06F 12/1009 711/202 |
| 2004/0236877 A1 * | 11/2004 | Burton | ............ | G06F 13/1668 710/22 |
| 2007/0067382 A1 * | 3/2007 | Sun | ............ | G06F 12/0862 709/203 |
| 2007/0073937 A1 * | 3/2007 | Feinberg | ............ | G06F 9/445 710/62 |
| 2011/0060617 A1 * | 3/2011 | Clark | ............ | G06Q 10/06 705/7.37 |
| 2012/0117318 A1 * | 5/2012 | Burton | ............ | G06F 13/1663 711/105 |
| 2012/0210046 A1 * | 8/2012 | Ito | ............ | G06K 19/07732 711/103 |
| 2012/0260024 A1 * | 10/2012 | Haywood | ............ | G06F 13/1642 711/103 |
| 2014/0165196 A1 * | 6/2014 | Dalal | ............ | G06F 13/1652 726/23 |
| 2015/0026397 A1 * | 1/2015 | Ping | ............ | G11C 5/04 711/105 |
| 2015/0089100 A1 * | 3/2015 | Vijayrao | ............ | G06F 15/167 710/260 |

(Continued)

OTHER PUBLICATIONS

Minnich et al. "The Memory-Integrated Network Interface." Feb. 1995. IEEE. IEEE Micro. vol. 15. pp. 11-19.*

(Continued)

*Primary Examiner* — Nathan Sadler

(57) ABSTRACT

An apparatus, method, and system are provided as a solution for computer operation. An embodiment of the apparatus includes a device that interconnects the core of the computer through the memory interface. The apparatus provides a communication path from the computer core to the world wide network. Computing communication and storage functions of the conventional computer are incorporated in the apparatus. The purpose of the apparatus is to enable the computer data and program to flow into and out of the computer core without being stored on a peripheral device such a disk or other media.

9 Claims, 9 Drawing Sheets

(56) References Cited

U.S. PATENT DOCUMENTS

| | | | |
|---|---|---|---|
| 2015/0169238 A1* | 6/2015 | Lee | G06F 12/0871 711/103 |
| 2015/0178243 A1* | 6/2015 | Lowery | G06F 3/0608 709/212 |
| 2015/0261698 A1* | 9/2015 | Zhang | G06F 13/1621 711/156 |
| 2016/0139807 A1* | 5/2016 | Lesartre | G11O 5/04 711/154 |

OTHER PUBLICATIONS

Tanabe et al. "MEMOnet : Network interface plugged into a memory slot." 2000. IEEE. Cluster 2000. pp. 17-26.*

Tanabe et al. "An enhancer of memory and network for applications with large-capacity data and non-continuous data accessing." Dec. 2009. Springer. Journal of Supercomputing. pp. 279-309.*

Samih et al. "A Collaborative Memory System for High-Performance and Cost-Effective Clustered Architectures." Oct. 2011. ACM. ASBD'11. pp. 4-12.*

Narayanan et al. "Whole-System Persistence." Mar. 2012. ACM. ASPLOS'12. pp. 401-410.*

DonDingee. "Bare Metal versus RTOS or Linux is a Core-by-Core Decision." Oct. 2012. http://community.embeddedswstore.com/t5/Embedded-Connection-Blogs/Bare-Metal-versus-RTOS-or-Linux-is-a-Core-by-Core-Decision/ba-p/290.*

Matthiaspaul. "Diskless node." Jul. 2013. Wikipedia. https://en.wikipedia.org/w/index.php?title=Diskless_node&oldid=564764995.*

Technical Standardization Committee on Semiconductor Devices. "Processor Enhanced Memory Module (PEMM)." Jul. 1998. Electronic Industries Association of Japan. EIAJ ED-5514.*

Ata Elahi. Network Communications Technology. 2001. Delmar. pp. 4-8.*

JEDEC. "FBDIMM Specification: DDR2 SDRAM Fully Buffered DIMM (FBDIMM) Design Specification." Mar. 2007. JEDEC.*

Docter et al. CompTIA A+ Complete Study Guide. 2009. Wiley. pp. 9-12, 89, and 90.*

Kim et al. "Memory-centric System Interconnect Design with Hybrid Memory Cubes." Sep. 2013. IEEE. Pact 2013. pp. 145-155.*

Leong et al. "Pilchard—A Reconfigurable Computing Platform with Memory Slot Interface." 2001. IEEE. FCCM '01.*

* cited by examiner

NETMORY

BACKGROUND

1. Field of the Invention

The present invention relates generally to optimizing computer performance.

2. Background

Modern computers are build based on an architecture with one or more execution units and multiple peripheral devices. One important peripheral device is the storage such as the hard drive.

Companies develop system programs called Operating System (OS), which are designed to run on the storage device. The operating system forms an environment for other companies or individuals to develop software applications.

Developers of software applications around the world target in their development to run on specific operating systems. Both the Operating System and the applications are designed to run out of the disk. In that regard the modern computer is "disk concentric".

The operating system gives to the developers a standardized environment with access to large hardware and software resources. Multiple Operating Systems exist. Example the series of operating systems MICROSOFT WINDOWS, APPLE MAC OS, LINUX, GOOGLE ANDROID. Thus application developers distribute several variations of their products to address the largest number of clients. For example: the MOZILLA foundation distributes an edition of their popular FIREFOX internet browser to target the operating system MICROSOFT WINDOWS as well as an edition for the operating system LINUX and another editions for the operating system GOOGLE ANDROID.

The developers around the world don't have the possibility to develop applications that run directly on a target architecture without Operating System. Thus the operating system and the storage device are sufficient necessities.

Software computer code are classified into several types. Depending on the purpose of the code and where the code is physically located. Micro-code is a collection of programs that operate hardware components. Example: Execution units like processors are built with logic gates and micro-code. Firmware is low level software program that operate platforms rather than components. A platform is a functional complete computer system based on several components. On the Personal Computer an important firmware is the BIOS (Basic Input Output System). The BIOS is a collection of programs that configures the hardware and interfaces with the operating system through standardized routines. While micro-code is located in the component, the firmware BIOS is located on the platform for example into a non-volatile memory assembled on the computer printed circuit. They are both designated as embedded software.

When the computer is switch on, it starts executing the BIOS computer code from the non-volatile memory. The BIOS controls and configures the system. When the configuration is completed, the BIOS gives control to the operating system by jumping to a program on the boot sector of the boot storage device. From that point, the BIOS is no longer in control. Rather the Operating System takes control of the program execution. This transition point between BIOS and Operating system corresponds generally to the transition from the on-board non-volatile memory to the storage device such the disk. This transition point corresponds equally to the transition from the embedded code to the normal code.

The present invention leads to a novel computer architecture in which there is no transition between the BIOS and the Operating System. Rather, the firmware keeps control of the execution indefinitely. Similarly there is no necessity of having an operating system neither a storage device that host the operating system and the applications.

The present invention addresses more specifically the way the data flow in the computer. It proposes a novel data flowing path which presents various advantages. This invention modifies the architectural foundation of the modern computer. Future computers that implement this invention are memory concentric rather than disk concentric.

With the present invention, developers around the world have the opportunity to develop applications for a target computer architecture rather than for target operating systems. The platform and the embedded firmware become the sufficient necessity for the developers because they provide the necessary hardware and software resources in particular the storage and the communication.

SUMMARY

An embodiment of the apparatus includes an interconnect from the CORE of the computer to the local area network and furthermore to the world wide web.

The local area network and the world wide web are designated hereby as WORLD.

The core of the computer designates the execution unit such as the processor also known as processing unit. The core includes also the surrounding processor logic such as the processor memory cache of all levels, the memory controller and the memory interface. The core designation excludes the peripheral controllers and the peripheral devices such as the storage disk controller and the storage device. Similarly the core excludes the peripheral network controller.

NETMORY is the novel interconnect between the core and the world. It is also called NETMORY in this document.

The Netmory major function is to provide a bridge or a path of communication for data and control signals allowing information data to flow back and forth between the core and the world without the necessity for the data to be stored on a peripheral device such as the traditional computer disk.

Netmory is coupled on one side with the memory interface of the core. Netmory is specified to serve requests of the core through its memory interface. In that regards, Netmory substitutes the computer main memory. For example the role of Netmory is to serve core memory write transactions as well as memory read transactions in a similar way of a memory module would serve those transactions.

The other end of Netmory is coupled with the network media to the world. The purpose of the interconnect with the world is to allow memory content to be loaded directly into the addressing space of the core.

The method includes controllers that moves content from the world and make the content available to the processors. The content is typically but not limited to: computer programs such internet browsers, computer games, accounting software as well as data such as word processor documents, spreadsheets and web pages.

Embodiments of the invention include as much as needed controllers such microprocessors, storage devices such disks, network controllers and busses in order to best perform as an intelligent subsystem.

Embodiments of the invention include a method for getting a variable size of memory.

Embodiments of the invention include a method for expanding the size of memory.

Embodiments of the invention include a method for the memory to appear as non volatile.

Embodiments of the invention include a method for sharing the memory with one or more computers located in the world.

In a conventional computer system, the processor expends a significant amount of time in loading programs and data into the memory from the storage device and freeing that memory at a later time. Features and advantages of this invention include a method for keeping the memory content available at all time in the core addressing space. Thus taking a substantial shorter time to execute a particular computing task. It is anticipated that the user interaction will be drastically improved as the user at no time will wait for program to load in memory. Consequently programs appear to run instantly.

It is noted that the invention is not limited to the specific embodiments described herein. Such embodiment is presented herein for illustrative purpose only. Additional embodiments will be apparent to persons skilled in the relevant art based on the teachings contained herein.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the relevant art to make and use the invention.

Other embodiments are possible, and modifications can be made to the embodiment within the spirit and scope of the invention. Therefore, the detailed description is not meant to limit the invention. Rather, the scope of the invention is defined by the appended claims.

It would be apparent to one of skill in the relevant art that the present invention, as described below, can be implemented in many different embodiment of software, hardware, firmware, and/or the entities illustrated in the figures.

Any actual software code with the specialized control of hardware to implement the present invention is not limiting of the present invention. Thus, the operational behavior of the present invention will be described with the understanding that modifications and variations of the embodiments are possible, given the level of details presented herein.

Similarly the block definitions in the diagram are not limiting. The implementation of the invention may vary by moving functions and logic from one block into another. The implementation logic and functions may also migrate from the invention shown in the diagram into the core or into the infra-structure of the network such as into the network hubs and the network switches or their respective interface.

Figure 1:
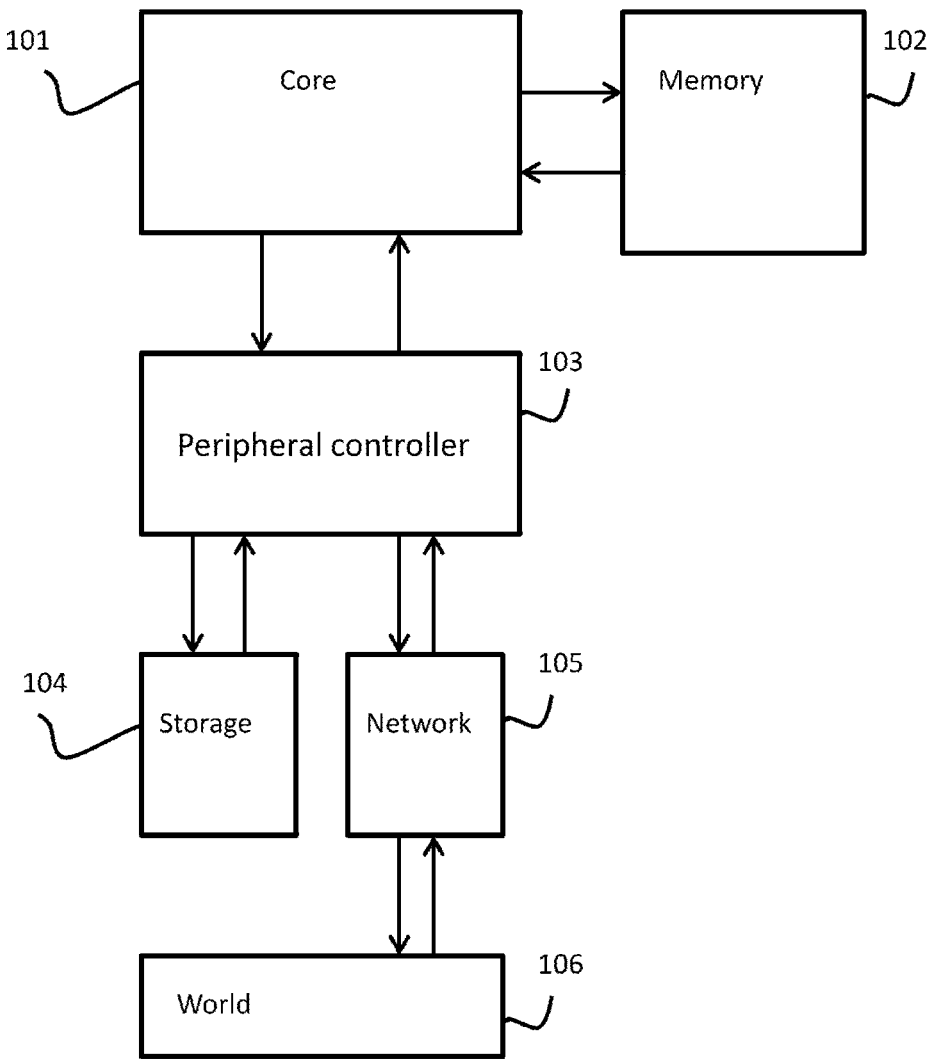

FIG. 1 is an illustration of a conventional computer system.

Figure 2:
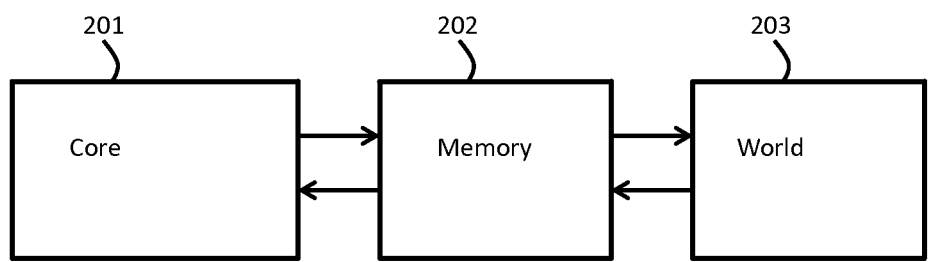

FIG. 2 is an illustration of an improved computer with Netmory.

Figure 3:
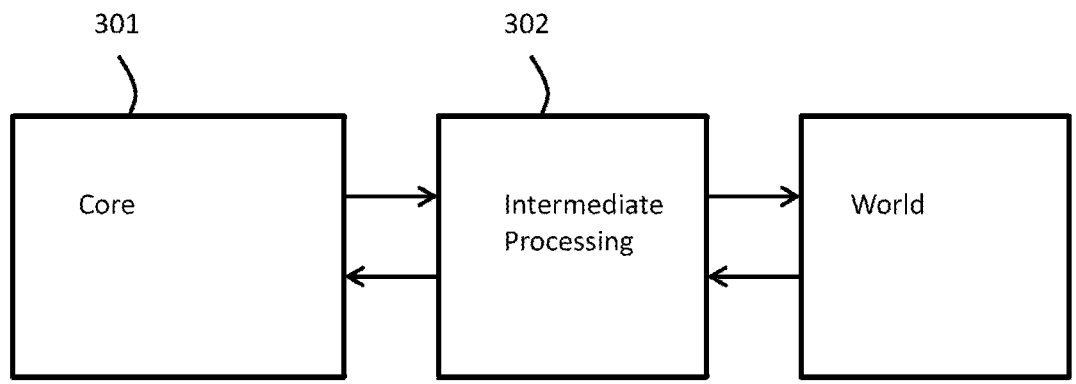

FIG. 3 illustrates the processing tasks and the data flow in a conventional computer system.

Figure 4:
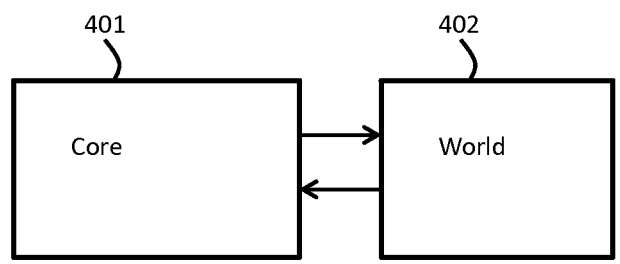

FIG. 4 illustrates the data flow on an improved computer with Netmory.

Figure 5:
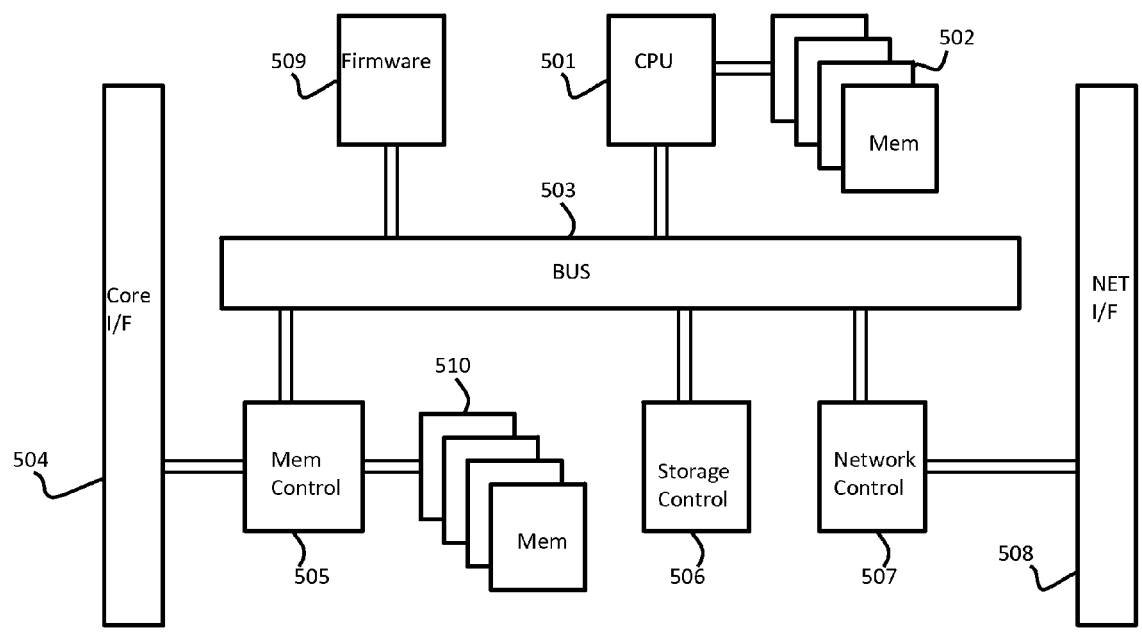

FIG. 5 shows an implementation of the Netmory interconnect.

Figure 6:
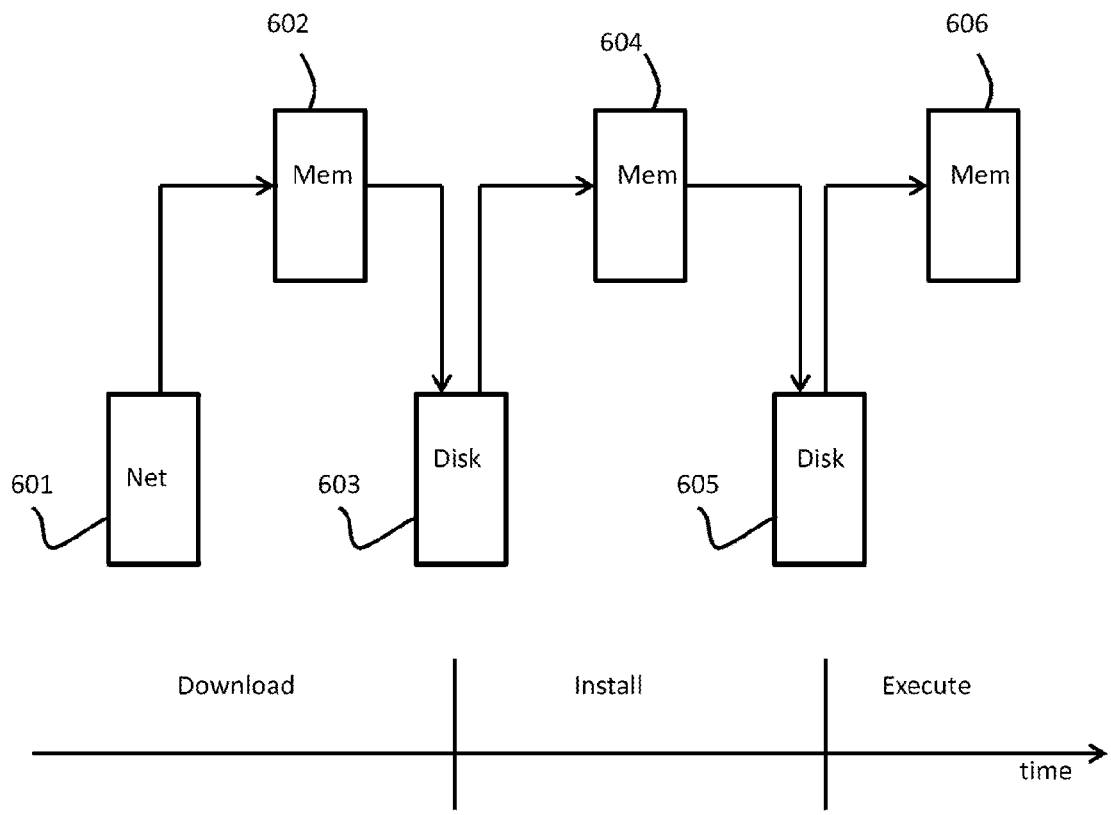

FIG. 6 illustrates the tasks during the lifetime of a program with a conventional computer.

Figure 7:
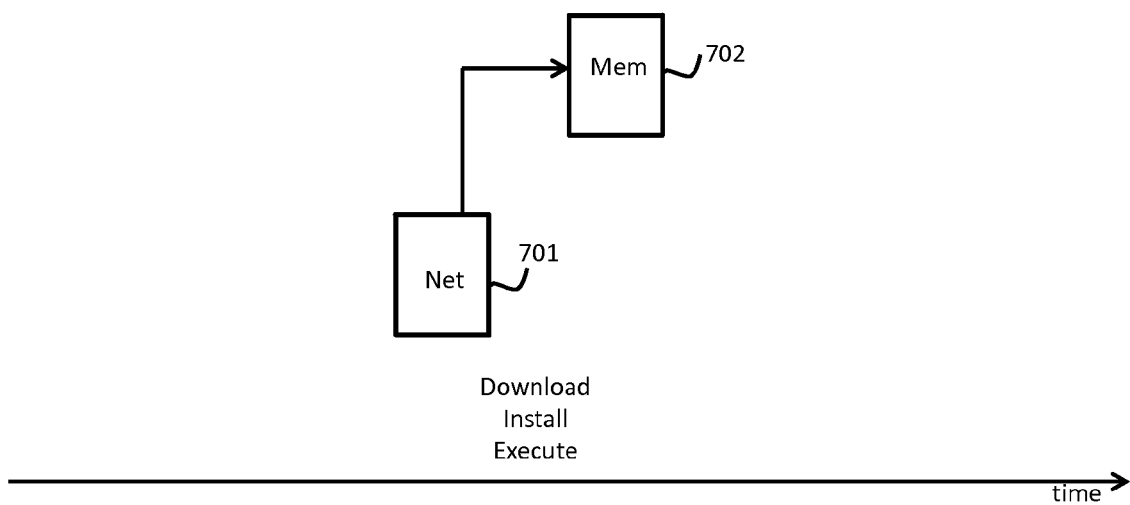

FIG. 7 illustrates the tasks during the lifetime of a program with an improved computer with Netmory.

Figure 8:
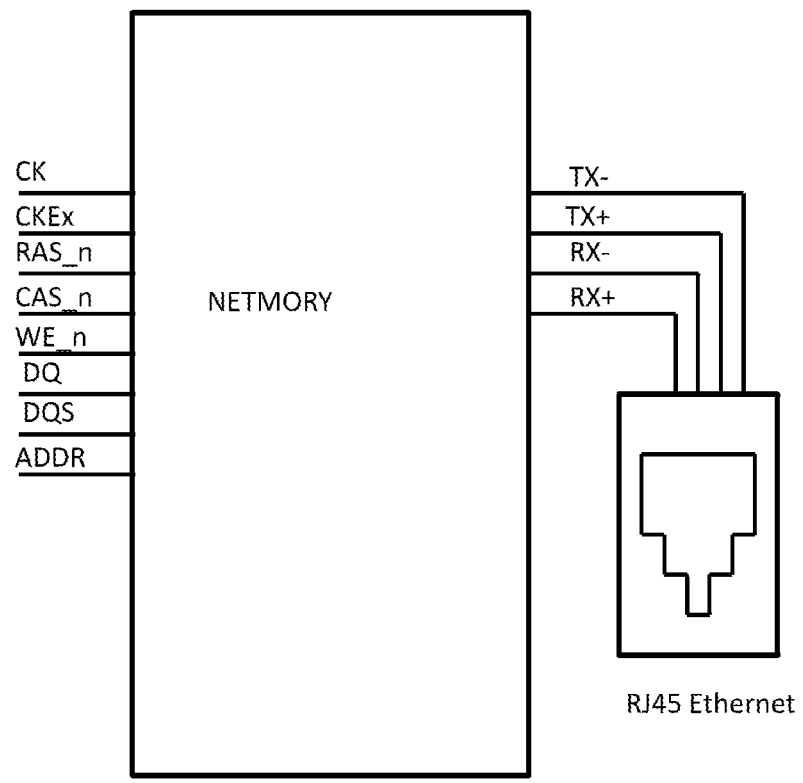

FIG. 8 shows the pin interface of Netmory.

Figure 9:
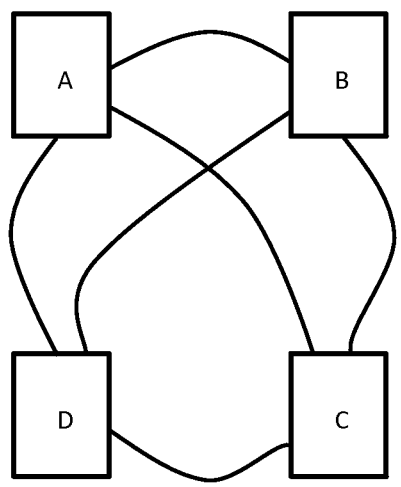

FIG. 9 shows the topology of a point to point network fully connected.

DETAILED DESCRIPTION

The following detailed description of the present invention refers to the accompanying drawings that illustrate exemplary embodiment consistent with this invention.

FIG. 1 is an illustration of a conventional computer system. Computer system of FIG. 1 includes a core 101 which is the main execution unit or central processing unit, Memory 102, Peripheral controller 103, medias such as storage 104 and network 105.

Core 101 communicates with Memory 102 with a industry standardized protocol. Core 101 fetches the instructions to execute from the Memory 102. Core 101 uses the memory 102 to save and recall data. Although the memory 102 is the major direct source of data feed for the core, the data is not born in the Memory 102 and must be first copied to the memory 102 from another source.

Core 101 communicates with the peripheral controller 103 and controls the peripheral devices 104 and 105. Peripheral devices 104 and 105 have an important role with the data flow of the conventional computer in FIG. 1.

Storage 104 is a non volatile storage device such as disk.

Network 105 is the media that connects the computer of FIG. 1 to the local area network and furthermore to the World Wide Web. For example network 105 is an Ethernet wired connection.

With conventional computer of FIG. 1, data is originally stored behind a peripheral device such as a disk or a network media. Thus in order for the computer to execute a specific computing task, the core 101 first move the specific program and data associated with this task from storage 104 to memory 102. Then core 101 transfers the specific program from memory 102 into the execution unit 101. Then the program is executed. Results are written back to memory 102 and if necessary saved back to the peripheral storage 104.

Similarly the data and programs are not born on the storage device 104. They are generally copied from an external media such as a DVD or originated from world 106 and copied into storage 104. The role of the core is to perform every movement of data by using the memory 102.

Consequently those data movements represent a substantial overhead in the total amount of tasks that the core is responsible for. The present invention optimizes the flow of data and drastically reduces the processing time.

With the current invention the data and programs appear for the core 201 to be born inside the memory 202. Therefore there is no requirement for the core to move the data and programs from or to peripheral devices. This is saving a large amount of processing and waiting time. It is anticipated to the user to feel like the program are executed instantly without delays for the programs to load.

Furthermore benefit of the current invention is the capability of the computer of FIG. 2 to share the memory service with the world. The memory service is the ability of the device to serve memory requests such as read or write. In the normal mode of operation, Netmory 202 serves requests from the core 201 with an immediate effect. However it is possible for Netmory 202 to serve similar requests from a remote computer in the world 203. Serving such requests requires transferring the data over the network in order to reach the remote computer with an additional delay.

FIG. 2. In comparison with FIG. 1, FIG. 2 illustrates a similar computer system with the present invention implemented in it. In the minimalistic build, the computer can operate with the following interconnects. Core 201 is coupled with Netmory 202. Netmory 202 provides the communication path for the core 201 and the world 203.

FIG. 3 illustrates in conventional computers the intermediate processing before the data is available to the core 301 for execution. The intermediate processing 302 represents the processing of the operating system which generally corresponds to movement of data on the storage device.

FIG. 4 illustrates the data flow with the present invention. In order to run a program, the core 401 issues a request to a remote computer in the world 402. Once the request is served, core 401 finds the program code in the core addressing space and can run it. Once the program is copied in the core addressing space, it can be executed indefinitely. Thus the copy of the program from the world 402 to the core 401 happens only one time.

FIG. 5 is an illustration of a possible implementation of the current invention.

FIG. 5 describes an independent subsystem that comprises computing capabilities with an execution unit 501, volatile memory 502, non-volatile memory for firmware 509, storage controller and storage devices 506, communication controller 507, controller for the core interface 504 and the immediate memory 510, one or more busses 503. The implementation in FIG. 5 incorporates all the necessary hardware firmware and software to operate independently. Subsystem of FIG. 5 operates in a similar manner as a traditional headless computer. It operates with preconfigured programs and has no or little interaction with users. Thus sub-system in FIG. 5 is equivalent to a computer with no display and not input devices such as keyboard or mouse. Being independent makes this invention superior to other counterparts that rely on existing hardware firmware or other software resources to achieve a similar purpose.

Independence.

The present invention is self sufficient and capable of achieving the connection between the core memory interface and the world network interface. Consequently this invention achieves this goal with the highest possible performance. This invention is then superior to other methods and apparatus for which their main goal is not to establish these interconnect but this connection is obtained as a secondary goal.

Dedication.

The present invention is dedicated to achieve the connection between the core memory interface and the world network interface. Consequently this invention achieves this goal with the highest possible performance. This invention is then superior to other methods and apparatus for which their main goal is not to establish these interconnect but this connection is obtained as a secondary goal.

The purpose of sub-system of FIG. 5 is to create a communication path for data and control signals between the core 504 and the world with the net I/F 508. The current invention is dedicated to this purpose and incorporates the best performing devices in order to achieve the best performing communication path between the core 504 and the world via net I/F 508. This dedication makes this invention superior to other counterpart that may create a similar path with a lower performance. FIGS. 1 and 3 illustrate similar low performing implementation over which this invention is superior. Although this dedication is not limiting this invention.

After the system is powered up, CPU 501 fetches instruction from firmware 509. Preconfigured programs are stored in Firmware 509 are loaded at startup into memory 502. They form the programs for operating the entire sub-system in FIG. 5. For example the running program initializes and operates network controller 507, storage controller and device 506, memory controller 505.

The role of the memory controller 505 is primarily to serve the requests from the core through core i/f 504. Thus the present invention would appear as a conventional memory to the core. For example serving memory read or write requests. The immediate memory 510 helps mem control 505 to achieve that role. Depending on the type of requests, a portion of the memory needs to be served instantly to the core. Thus memory 510 would be the source for those urgent requests. Other core requests for another portion of the memory may be served with a longer delay. For those request the mem controller 505 would source the content from the storage 506. Another portion of the memory with a longer delay is sourced from the world through net i/f 508.

Because the current invention comprises non-volatile memory storage 506, the current invention is capable to appear to the core as non volatile memory. Thus the core is not required to save the memory content when the power is switched off. In FIG. 1, memory 102 is volatile and the core is required to load and save the content usually on storage 104. With the current invention of FIG. 2, this operation is not required because the Netmory 202 feels like non-volatile.

Storage control 506 is a controller coupled with a storage device. Typically a disk controller and a disk drive.

Network control 507 is a network controller coupled with a network media typically an Ethernet controller 507 coupled with Ethernet wires 508.

Firmware 509 is a non-volatile memory that contains firmware code. Typically an EEPROM.

CPU 501 is a microprocessor or micro controller. This is the main execution unit of the subsystem. CPU 501 communicates with all the controllers on the sub-system. It coordinates the copy of data from block to block.

Core I/F 504 is the memory interface of the core 201.

Bus 503 is interconnect for multiple components. It provides a communication path between the processing unit 501 the firmware 509 and the other controllers 505, 506, 507.

FIG. 6 is a detail of box 302 of FIG. 3. FIG. 6 illustrates an example of the data flow with a conventional computer that is connected with the world. The life of a computer program starts by being downloaded from the world 601 to the storage device 603. During this download the data transits in the memory 602. The next step is the installation. The program is installed and copied in a different location of the storage device 605. During this installation the data also transits in the memory 604. Once installed, the user can run the program. The program code is then copied from the storage device 605 into the core memory addressing space 606.

FIG. 7 shows the equivalent processing tasks of FIG. 6 required with the present invention. The program data that is originated from the world 701 is fed directly into the execution unit addressing space 702 and is available for execution. The download install and execution tasks are combined. Thus saving a significant amount of system time and power.

FIG. 8 defines the pin interface of Netmory. The interface is composed from two groups of signals. The first group is the interface with the core. The core interface signals are the signals that interface a memory module. Example ADDR, CK, RAS, CAS and other signals. This is typically but not limited to a Double Data Rate (DDR) memory interface. The second group of signals is the interface with the world. Typically this is an Ethernet interface with transmit and receive signals. Bus interfaces change frequently in the computer industry. It is understood that this definition is provided only as an example of implementation for this invention.

FIG. 9. This figure shows a network of four computers designated by A, B, C and D which are incorporating the present invention. Those terminals are connected through a point to point network. This means that any terminal can connect and exchange data with any other terminal in the network. This network topology is suitable for Netmory. At any given time, terminal A can receive or send data to B, C or D. The same applies for the other terminals in the network. This figure is a simplistic representation of the world.

Flexibility.

Traditional computers are assigned a fixed amount of memory when they are assembled. This amount of memory is one of the major parameters determining the system performance. During the initialization, the BIOS computes the Top of the Memory which corresponds to the highest address of available memory. Thus when the core accesses to addresses above the top of the memory, invalid data is returned. The data is valid only for the addresses below the top of the memory. In traditional computer, the top of the memory is consequently a fixed address that does not change during the life time of the computer. The present invention, allows the computer to have a variable amount of memory and a variable value of the top of the memory. For example in the network described in FIG. 9, the four computers A, B, C and D are powered on and running. At a given time computer A is active while the other computers B, C and D are idle. The present invention allows the computers B, C and D to share the unused portion of their memory with computer A. In such situation, computer A will have his total amount of memory increased while computers B, C and D will have their total amount of memory decreased. Transferring the memory resource over the network makes the memory allocation flexible and scalable.

Remote and Local Memory.

Local memory defines the memory components that are physically located inside the chassis of the terminal. Example DDR memory chips that are inside the housing of a cellular phone are considered local to this cellular phone. As oppose to remote memory which are memory components that are located on other phones and servers. The present invention is capable of connecting remote memory to a local machine. Thus Netmory makes appear remote memory as local memory, expanding indefinitely the memory capacity of the local device.

Memory Trade.

This invention has an impact on the way the memory is traded. For traditional computers, the memory modules are purchased as consumable items. The present invention allows the memory to be traded as a service. For example in the network described in FIG. 9, computer A request memory resource from computer B. Computer B is actually the front end of a data center with a large amount of available memory. Computer B may belong to a separate company which offers to share memory as a paid service.

What is claimed is:

1. An apparatus for optimizing computer performance comprising: an interconnect comprising only two interfaces: a memory interface serving a core and an Ethernet interface connecting a world network, wherein the interconnect is configured to increase and decrease an amount of memory by transferring the memory resource over the world network, wherein a local computer that incorporates the interconnect is configured to share memory with a remote computer that incorporates the interconnect, wherein the local computer that incorporates the interconnect and the remote computer that incorporates the interconnect are configured to connect through a point to point network.

2. The apparatus of claim 1 further comprising a storage controller and a storage device and a mechanism to make the memory appear to the core as non volatile.

3. The apparatus of claim 2 wherein the interconnect is configured to serve memory to the remote computer in the world.

4. The apparatus of claim 3, further comprising: enabling the trade of memory as a service.

5. The apparatus of claim 3, where the interconnect is further configured to make remote memory appear as local memory.

6. The apparatus of claim 2 enabling the size of the memory to be expanded.

7. The apparatus of claim 2, wherein the local computer system is enabled to operate without peripheral storage device.

8. The apparatus of claim 2, wherein the local computer is enabled to operate without an operating system.

9. A method for optimizing computer performance comprising: feeding a content of a core memory from a world wide web without being intermediately stored on a peripheral device, feeding a memory of a remote core in the world wide web, and increasing and decreasing an amount of memory by transferring the memory resource over the world wide web with a remote computer in the world wide web that incorporates the method.

* * * * *